United States Patent
Tyson et al.

[11] Patent Number: 5,811,855
[45] Date of Patent: Sep. 22, 1998

[54] SOI COMBINATION BODY TIE

[75] Inventors: Scott M. Tyson, Albuquerque, N. Mex.; Richard L. Woodruff, Fort Collins, Colo.

[73] Assignee: United Technologies Corporation, Hartford, Conn.

[21] Appl. No.: 999,491

[22] Filed: Dec. 29, 1997

[51] Int. Cl.$^6$ ............................. H01L 29/41; H01L 29/78
[52] U.S. Cl. ............................. 257/349; 257/57; 257/66; 257/345; 257/347
[58] Field of Search ............................. 257/347, 57, 66, 257/350, 69, 372, 367, 345, 349

[56] References Cited

U.S. PATENT DOCUMENTS

| | | | |
|---|---|---|---|
| H1435 | 5/1995 | Cherne et al. | 257/347 |
| 5,145,802 | 9/1992 | Tyson et al. | 437/63 |
| 5,160,989 | 11/1992 | Houston | 257/347 |
| 5,185,280 | 2/1993 | Houston et al. | 437/44 |
| 5,298,773 | 3/1994 | Woodruff | 257/204 |
| 5,317,181 | 5/1994 | Tyson | 257/347 |
| 5,405,795 | 4/1995 | Beyer et al. | 437/41 |
| 5,489,792 | 2/1996 | Hu et al. | 257/347 |
| 5,536,950 | 7/1996 | Liu et al. | 257/59 |
| 5,637,899 | 6/1997 | Eimori et al. | 257/347 |
| 5,693,959 | 12/1997 | Inoue et al. | 257/347 |

Primary Examiner—Jerome Jackson
Assistant Examiner—Hung Van Duong
Attorney, Agent, or Firm—Donald S. Holland, Esq.; Holland & Bonzagni, P.C.

[57] ABSTRACT

An H-transistor, fabricated in a silicon-on-insulator ("SOI") substrate, includes opposing source and drain terminals or regions flanking a centrally-located body node or well. Above the body node or well is formed the H-shaped gate terminal of the transistor. One or more shunt body contacts or ties bisect the source terminal and connect the source terminal of the transistor to the underlying body node. In this way, the body node or well is no longer electrically "floating", but, instead, is connected to the fixed ground potential of the source terminal of the transistor.

20 Claims, 2 Drawing Sheets

SOI COMBINATION BODY TIE

DESCRIPTION

1. Technical Field

This invention relates to integrated circuits ("ICs"), and more particularly to the structure of an H-transistor, formed within a silicon-on-insulator ("SOI") IC semiconductor substrate, having a shunt electrical connection between a body node of the H-transistor and a source terminal of the H-transistor.

2. Background Art

Modern SOI technology for IC fabrication involves the formation of transistors, either bipolar or MOS, in certain regions or "mesas" within a layer of semiconductor material, typically monocystalline silicon. The silicon mesas overlie a layer of an insulating material, typically silicon dioxide or sapphire. In turn, the insulating layer overlies a silicon semiconductor substrate, usually either doped or undoped monocrystalline silicon. In SOI technology, the silicon transistor mesas are isolated from the silicon substrate by the oxide insulating layer.

SOI technology offers a number of significant advantages relative to traditional transistor formation in a bulk silicon wafer. For example, bulk silicon transistors have their active terminals disposed adjacent the bulk silicon wafer. As a result, parasitic capacitance is present at the junction between the source and drain regions of an MOS transistor and the well or bulk silicon substrate. Other problems with bulk silicon transistors include the possibility of junction breakdown between the source or drain regions and the wafer, together with the formation of undesired parasitic bipolar transistors giving rise to device latch-up problems.

In contrast, SOI transistors have their active regions (i.e., the source, drain and channel regions of an MOS transistor) formed adjacent the underlying insulating layer. As such, these SOI transistors eliminate or significantly reduce the formation of undesired parasitic elements. SOI technology also significantly reduces junction capacitance and junction leakage due to the reduced exposed junction area. This reduced parasitic capacitance leads to increased performance and higher density ICs. Also, SOI transistors offer inherent radiation hardness, better high temperature performance, higher current driving ability and lower leakage current.

However, the use of SOI technology in fabricating MOS transistors has its own inherent problems. All of these problems can be attributed primarily to the fact that, in an SOI MOS transistor, the body node or well underlying the transistor gate terminal is isolated from the bulk silicon substrate by the insulating layer. Thus, the body node is electrically floating. Most often, this floating body is undesirable since it causes problems in SOI transistor operation. For example, for a partially-depleted MOS transistor, a phenomenon associated with impact ionization can occur. More specifically, when an electron-hole pair is formed by ionization of a lattice atom by an electron, the hole migrates towards the source of the transistor. Since the well is not tied to the source, the excess holes generated will collect in the well, thereby raising the well potential and, thus, modifying the transistor characteristics. The resulting change in voltage lowers the effective threshold voltage relative to the drain-to-source voltage, and increases the drain current. This results in the well-known "kink" or sharp irregularity in the current-voltage ("I–V") curves of the partially-depleted MOS SOI transistor. This "kink" effect may seriously degrade SOI transistor performance. In contrast, hole migration is not a problem with transistors formed in a bulk silicon semiconductor wafer, because the holes are attracted towards the wafer and away from the body node.

The floating body node of an SOI MOS transistor presents additional problems. For example, it may permit parasitic NPN devices to be undesirably turned on. Further, a parasitic back channel transistor, comprised of the substrate acting as the gate and the insulating layer acting as the gate dielectric, may provide a drain-to-source leakage path along the body node near its interface with the insulating layer. Also, undesirable capacitive and diode coupling may exist.

Despite its drawbacks, the floating body node sometimes provides certain advantages in SOI transistor operation. For example, a floating body node provides higher drive current through the channel region, which provides for faster operation of the IC.

To counter the inherent problems associated with the floating body node of an SOI transistor, it is known to connect the body node to the source terminal. In normal transistor operation, the source terminal is connected to electrical ground potential. The holes generated by impact ionization are then attracted to the fixed ground connection through the body contact or tie. Some specific modern approaches for connecting the body node to a fixed potential include the body-tied-to-source ("BTS") structure (also known as a well shunt or well contact), H-type gate structure devices ("H-transistors"), T-type gate structure devices, and local well ties. However, each approach has numerous drawbacks.

For example, BTS structures are typically fabricated at the outer periphery of the active transistor regions. Generally, if contact to the body node is made outside the source terminal, the body contact takes up valuable area on the substrate, reducing the electrical width of the active transistor regions and providing a lower packing density. Also, the body contact may reduce the amount of current that can be handled by the transistor. BTS structures are also extremely sensitive to the alignment achievable using various IC processing techniques. Further, BTS structures result in unidirectional transistor operation (i.e., the source and drain terminals cannot be used interchangeably).

Another problem with this type of body contact is "snapback". More specifically, as a result of electron/hole generation at the drain of an N channel transistor through impact ionization, hole current flows to the substrate contact of the P well. For bulk silicon transistors, the cross-sectional area to the P well contact is large and the resistance is small. On the other hand, thin film SOI devices have a much smaller cross-sectional area and a corresponding increase in body contact resistance. Thus, the only conduction path to the body contact is under the channel, which further reduces the cross-sectional area.

Consequently, the same amount of hole current generated in an SOI device passes through a much smaller cross-sectional area relative to a bulk transistor, which causes a much larger voltage rise in the channel region. This voltage rise lowers the barrier at the source and injects more electrons into the channel region. This increase in current causes a larger amount of hole current to be generated, which results in additional barrier lowering. The cycle continues. The barrier is lowered even more; more electrons are injected into the channel region; more hole current is generated; and the barrier lowers still more. This uncontrolled state, caused by the hot carrier effect, is known as "snapback". The hot carrier effect is primarily a problem with N-channel devices because of the high electron mobility. Essentially, as impact ionization occurs and more electron-hole pairs are created, the holes continue to raise the well potential. Eventually, the transistor enters the snapback state and latches on. In this internal latch-up state, the transistor cannot be shut off unless the power supply is removed.

H-transistors are generally only effective below a certain device width for a given film thickness and doping profile. Above this width, the resistance of the well or body node becomes prohibitively high, thereby negating the effectiveness of the resulting transistor. That is, as the well resistance rises, the corresponding voltage rise across the body node becomes undesirably large. Further, there is a significant IC substrate area penalty associated with the use of these body contacts. Generally, H-transistors have not utilized BTS structures.

H-transistors have utility in that they enable bidirectional device operation, which allows their use in gate arrays. H-transistors allow for a large width layout of the transistors on a thin film SOI IC. U.S. Pat. No. 5,298,773, which is incorporated herein by reference, describes and illustrates a gate array comprising a plurality of H-transistors. However, the H-transistor described in that patent has a body contact on the outside of the source and drain regions, as is typical of BTS structures. As mentioned, the BTS body contact is problematic in that as the width of the underlying channel increases, an undesirable large resistance value and corresponding voltage rise develops across the channel, which can degrade device performance.

Nonetheless, H-transistors are used to avoid the hot carrier effect. H-transistors allow the substrate containing the well contacts to be as close as possible to the channel where the carriers are being generated. Also, H-transistors provide a more efficient collection of hole carriers, and they reduce the changes in potential, thereby reducing the tendency of the transistor to go into an internally latched-up state. The use of H-transistors in a gate array architecture substantially alleviates the hot carrier effect, which causes the aforementioned snapback phenomenon.

T-type devices have similar problems as H-transistors, except that they require device widths only about one-half of those used with H-transistors. As such, only one side of the T-type device is effective in suppressing parasitic sidewall characteristics of the underlying transistor. Similar to H-transistors, T-type devices have not utilized BTS structures.

Local well ties offer little, if any, advantage to SOI transistor device designs. The disadvantages associated with local well ties include an area penalty, difficulty in using a trench isolation structure, relatively high well resistance and no suppression of parasitic sidewall characteristics. However, this approach is compatible with bulk silicon circuit layouts.

Some exemplary prior art body contacts are described and illustrated in U.S. Pat. Nos. 5,145,802, 5,160,989, 5,185,280, 5,298,773, 5,317,181, 5,405,795, 5,489,792 and 5,637,899, and U.S. Statutory Invention Registration No. H1435.

DISCLOSURE OF INVENTION

Objects of the invention include the provision of a fixed voltage potential for the body node of an SOI H-transistor through use of a shunt contact between the H-transistor body node and source terminal, the reduction of an undesirable voltage rise across the underlying channel of an SOI H-transistor, and the reduction of misalignment problems with prior art outer periphery shunt ties for SOI H-transistors. Still other objects include the allowance for relatively large width thin film SOI H-transistors without a corresponding resistance and voltage rise penalty, and the suppression of parasitic sidewall characteristics.

According to the invention, an H-transistor fabricated in an SOI substrate utilizes one or more shunt well contacts or body ties which connect the body node of the transistor to the fixed potential at the source terminal of the transistor. In a preferred exemplary embodiment, the body contact bisects the source terminal to connect the source terminal with the body node.

The above and other objects and advantages of this invention will become more readily apparent when the following description is read in conjunction with the accompanying drawings.

BEST MODE FOR CARRYING OUT THE INVENTION

Figure 1:
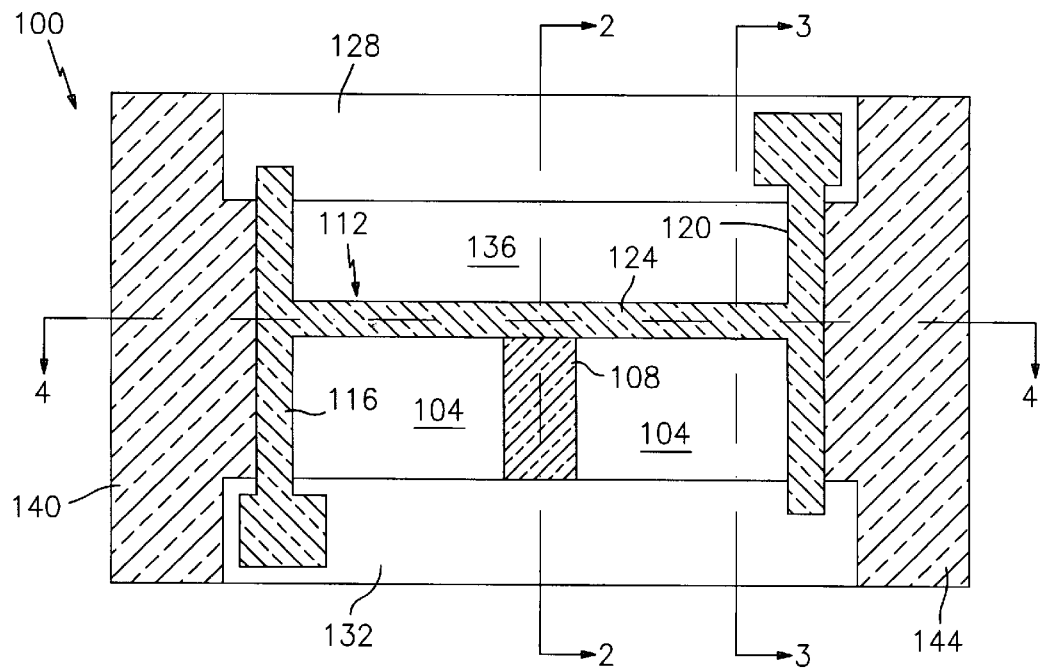
FIG. 1 is a plan view of an SOI H-transistor constructed with the body contact bisecting the source terminal in accordance with the present invention.

Referring to FIG. 1, the MOS H-transistor 100 illustrated therein has a source terminal region 104 bisected by the combination body contact or tie 108 of the present invention. The body contact 108 of the invention is primarily disclosed herein for use with an MOS SOI H-transistor, although it could be used with other transistor configurations and types (e.g., bulk silicon transistors) in light of the teachings herein.

The H-shape of the gate terminal 112 of the transistor 100 is best viewed in FIG. 1. The gate terminal 112 has two substantially parallel members 116,120 connected together by an integral cross member 124. Each of the four end portions of the gate terminal 112 partially overlie a corresponding pair of field oxide regions 128,132. Disposed on one side of the integral cross member 124 is the drain region 136 of the SOI MOS H-transistor 100. The drain region 136 may be appropriately doped N+. On the opposite side of the integral cross member 124 is disposed the source terminal 104, which may also be appropriately doped N+. Bisecting the source terminal region is the well shunt or body contact 108 of the present invention, which may be appropriately doped P+. Disposed on the outside of each parallel side member 120 of the gate terminal 112 is a diffusion region 140,144, appropriately doped, for example, P+.

Figure 2:
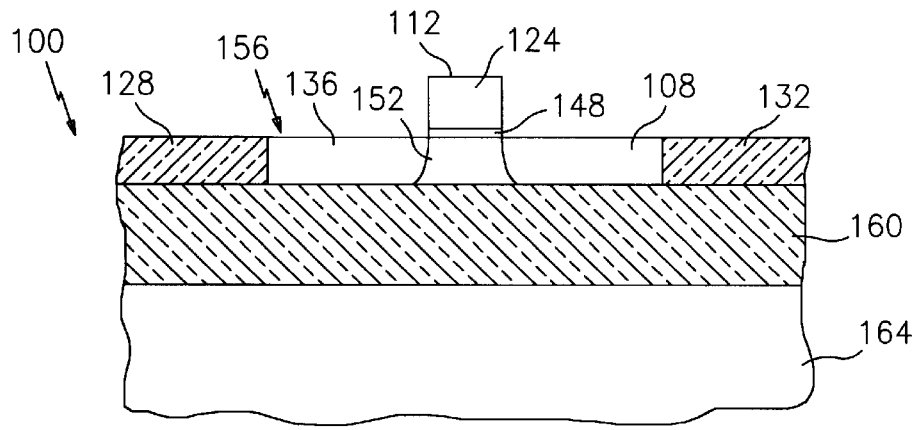
FIGS. 2–4 are several cross-sectional views of the SOI H-transistor taken respectively along the lines 2—2, 3—3 and 4—4 of FIG. 1.

As shown in the cross-sectional illustration of FIG. 2, the SOI MOS H-transistor 100 has the gate terminal 112 formed to a thickness ranging from approximately 1000 to 5000 Angstroms. The gate terminal cross member 124 overlies a thin layer 148 of gate oxide material. This gate oxide layer 148 overlies a channel region 152, doped, e.g., P−. The doping of the P− channel region 152 is approximately $1\times10^{17}$ to $5\times10^{17}$ atoms per cubic centimeter of an impurity such as boron. To the left of the P− channel region 152 is the drain region 136. The heavily doped N+ drain region 136 contains approximately $5\times10^{19}$ to $5\times10^{20}$ atoms per cubic centimeter of impurity such as phosphorous. Disposed to the right of the P-channel region 152 in FIG. 2 is the bisecting body contact 108 of the present invention. To the left of the drain region 136 is disposed the field oxide region 128. Similarly, to the right of the body contact region 108 is another field oxide region 132. These field oxide regions 128,132 may be formed, e.g., by the well-known LOCOS method or mesa isolation.

The source 104, drain 136, channel 152 and body contact 108 are all formed in a layer 156 of silicon, which overlies a layer 160 of a dielectric material. The silicon layer 156 is preferably of a thickness of approximately 1000–10,000 Angstroms, while the insulator film 160 is approximately 3500–4000 Angstroms in thickness. The insulator film 160 may comprise silicon dioxide, sapphire, spinel, or other appropriate insulating material. The insulating layer 160 overlies a bulk silicon substrate 164 that is approximately 400–600 microns in thickness. Together, the silicon layer 156, the underlying insulating layer 160, and the bulk silicon substrate 164 comprise a well-known, commercially-available SOI transistor substrate. The SOI substrate may be formed by any suitable method, such as the implanted oxygen method ("SIMOX") or the bonded-and-etchback method ("BESOI").

Figure 3:
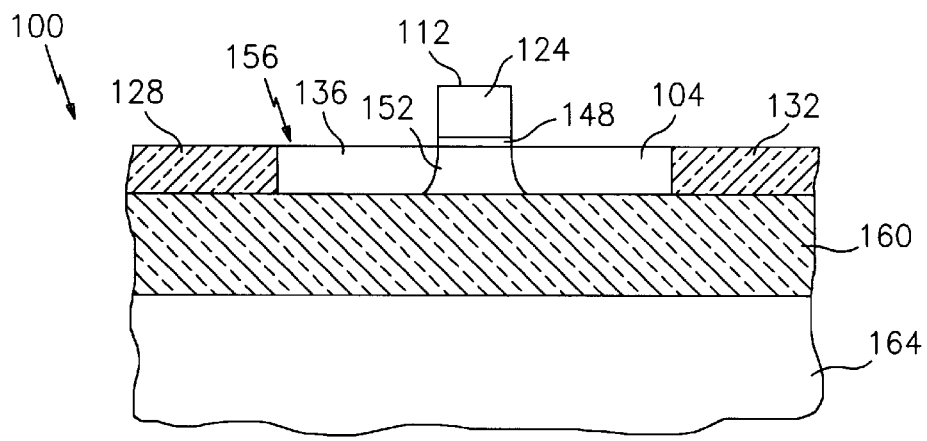
Figure 4:
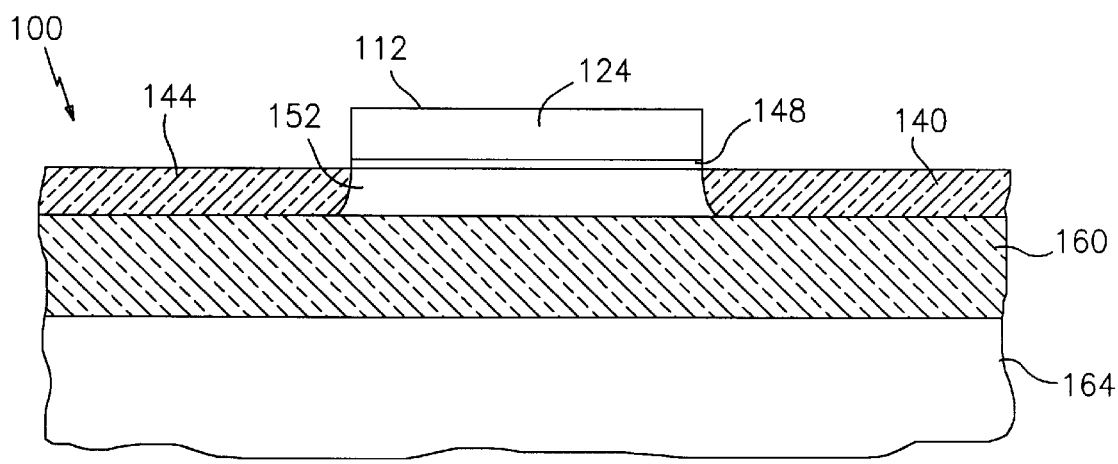

Referring now to FIG. 3, to the right of the channel region 152 is disposed the source region 104 of the SOI MOS H-transistor 100. Although not shown in the figures, typically overlying metallization connects the gate 112, drain 136 and source 104 to appropriate voltage potentials. Typically, for an MOS SOI H-transistor 100, the source 104 is connected to electrical ground potential. The bisecting body contact 108 of the present invention effectively connects the underlying channel region 152 to the source terminal region 104, thereby connecting the channel 152 to electrical ground potential. As such, the channel 152 is no longer electrically floating. FIG. 4 illustrates the underlying channel region 152 flanked on either side by the P+ diffusion regions 140,144.

Figure 5:
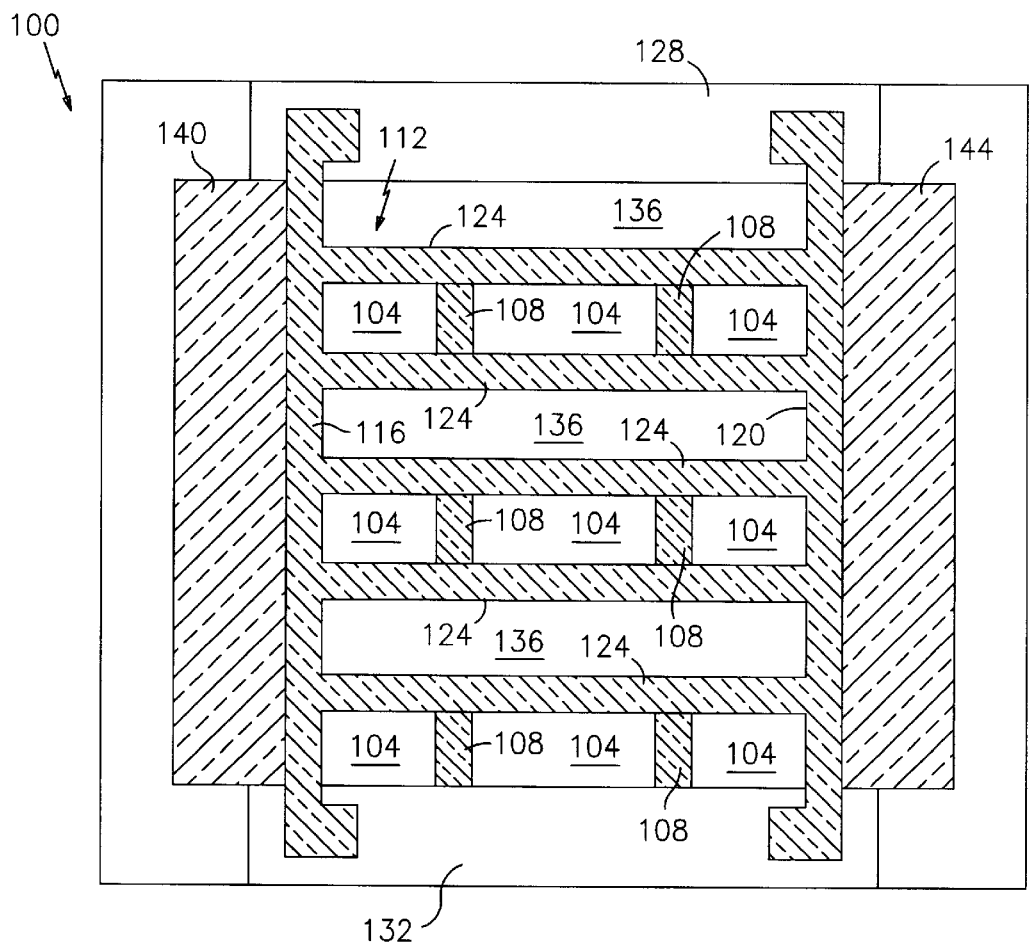
FIG. 5 is a plan view of an SOI H-transistor constructed with a plurality of body contact bisecting the source terminal in accordance with an alternative embodiment of the present invention as used in a high current drive buffer.

FIG. 5 illustrates an alternative embodiment of the body contact 108 of the present invention, wherein the gate terminal 112 of the H-transistor 100 has a plurality of integral cross members 124 connected between the two parallel side members 116,120 of the gate terminal. In this alternative embodiment, each source region 104 has two bisecting body contacts 108 connecting the corresponding plurality of channel regions 152, underlying the cross members 124 of the gate terminal 112, with the fixed electrical potential on the source regions 104.

In this alternative embodiment, all of the plurality of body contact regions 108 are formed as bisecting the corresponding source regions 104, and not at the outer periphery thereof. FIG. 5 illustrates each source terminal 104 as having two bisecting body contact regions 108. However, this number of body contact regions is purely exemplary. The actual number of bisecting body contact regions provided depends on the ultimate width of the integral cross members 124 of the gate terminal 112 and the corresponding underlying channel regions 152. As mentioned hereinbefore, as the width of the transistor channel region 152 increases, the corresponding resistance of the channel region 152 may become prohibitively high. The bisecting body contact 108 of the present invention alleviates this high resistance by connecting the underlying channel region to electric ground potential. Thus, it should be apparent to one of ordinary skill in the art, in light of the teachings herein, that the number of bisecting body contact regions 108 utilized, in accordance with the present invention, depends on the transistor fabrication steps utilized and the associated dimensions of the resulting H-transistor 100. Ideally, though, the number of bisecting body contacts utilized should be chosen to reduce or eliminate the increasing high resistance of the channel 152 as the channel width increases.

The H-transistor 100 illustrated in FIG. 5 finds use especially in a high current capability device, such as an output driver or buffer. Such a device typically requires a relatively large width transistor. Further, although not shown in the figures, the H-transistor 100 of either FIG. 1 or FIG. 5 may be repeated a number of times into a gate array configuration comprising a plurality of such transistors. The aforementioned U.S. Pat. No. 5,298,773, which is hereby incorporated by reference, describes and illustrates a gate array comprising a plurality of H-transistors. However, as mentioned before, the H-transistor employed in that patent utilizes an outer periphery body contact structure, which could lead to various structural and functional problems.

It should be understood by those skilled in the art that obvious structural modifications can be made, in light of the teachings herein, without departing from the scope of the invention. Accordingly, reference should be made primarily to the accompanying claims, rather than the foregoing specification, to determine the scope of the invention.

Having thus described the invention, what is claimed is:

1. A transistor formed in a semiconductor layer disposed over an insulator film located on top of a semiconductor substrate, the transistor comprising:

a gate terminal having two parallel side members and at least one integral cross member;

a channel region underlying the cross member of the gate terminal;

a gate insulator region disposed between the cross member of the gate terminal and the channel region thereby electrically insulating the cross member of the gate terminal from the channel region;

a source terminal region located on a first side of the cross member of the gate terminal and between the two parallel side members of the gate terminal;

a drain terminal region located on a second side of the cross member of the gate terminal and between the two parallel side members of the gate terminal, wherein the second side of the cross member of the gate terminal is opposite the first side of the cross member of the gate terminal; and at least one body contact region bisecting the source terminal region wherein portions of the source terminal region are disposed on both sides of the at least one body contact region, the at least one body contact region electrically connecting the source terminal region with the channel region.

2. The transistor of claim 1, wherein the source terminal region and the drain terminal region are of the same conductivity type whereas the channel region is of the opposite conductivity type as that of the source terminal region and the drain terminal region.

3. The transistor of claim 1, wherein the at least one body contact region is of the opposite conductivity type as the conductivity type of the source terminal region.

4. The transistor of claim 1, wherein the semiconductor layer comprises silicon.

5. The transistor of claim 1, wherein the insulator layer comprises silicon dioxide.

6. The transistor of claim 1, wherein the insulator layer comprises sapphire.

7. The transistor of claim 1, wherein the insulator layer comprises spinel.

8. The transistor of claim 1, wherein the semiconductor substrate comprises silicon.

9. The transistor of claim 1, wherein the at least one body contact region has two opposite ends, a first one of the two ends is electrically connected to the channel region, a second one of the two ends terminates at an electrically-insulating region.

10. The transistor of claim 1, wherein the gate terminal has a plurality of integral cross members, each one of the plurality of cross members being connected between the two parallel side members of the gate terminal.

11. The transistor of claim 1, further comprising a plurality of body contact regions, each one of the plurality of body contact regions bisecting the source terminal region wherein portions of the source terminal region are disposed on both sides of the each one of the plurality of body contact regions, each one of the plurality of body contact regions electrically connecting the source terminal region with the channel region.

12. The transistor of claim 11, wherein each one of the plurality of body contact regions has two opposite ends, a first one of the two ends is electrically connected to the channel region, a second one of the two ends terminates at an electrically-insulating region.

13. An H-transistor formed in a semiconductor substrate, comprising:
- a gate terminal having two parallel side members and at least one integral cross member, the integral cross member being disposed at substantially a right angle to the two parallel side members;
- a channel region underlying the cross member of the gate terminal;
- a gate insulator region disposed between the cross member of the gate terminal and the channel region thereby electrically insulating the cross member of the gate terminal from the channel region;
- a source terminal region located on a first side of the cross member of the gate terminal and between the two parallel side members of the gate terminal;
- a drain terminal region located on a second side of the cross member of the gate terminal and between the two parallel side members of the gate terminal, wherein the second side of the cross member of the gate terminal is opposite the first side of the cross member of the gate terminal; and
- at least one body contact region bisecting the source terminal region wherein portions of the source terminal region are disposed on both sides of the at least one body contact region, the at least one body contact region electrically connecting the source terminal region with the channel region.

14. The transistor of claim 13, wherein the source terminal region and the drain terminal region are of the same conductivity type whereas the channel region is of the opposite conductivity type as that of the source terminal region and the drain terminal region.

15. The transistor of claim 13, wherein the at least one body contact region is of the opposite conductivity type as the conductivity type of the source terminal region.

16. The transistor of claim 13, wherein the semiconductor layer comprises silicon.

17. The transistor of claim 13, wherein the insulator layer comprises silicon dioxide.

18. The transistor of claim 13, wherein the at least one body contact region has two opposite ends, a first one of the two ends is electrically connected to the channel region, a second one of the two ends terminates at an electrically-insulating region.

19. The transistor of claim 13, wherein the gate terminal has a plurality of integral cross members, each one of the plurality of cross members being connected between the two parallel side members of the gate terminal, and further comprising a plurality of body contact regions, each one of the plurality of body contact regions bisecting the source terminal region wherein portions of the source terminal region are disposed on both sides of the each one of the plurality of body contact regions, each one of the plurality of body contact regions electrically connecting the source terminal region with the channel region.

20. An H-transistor, comprising:
- a gate terminal having two parallel side members and a plurality of integral cross members;
- a channel region underlying each one of the plurality of cross members;
- a gate insulator region disposed between each one of the plurality of cross members of the gate terminal and the corresponding each one of the plurality of channel regions thereby electrically insulating the cross members of the gate terminal from the channel regions;
- a source terminal region located on a first side of selected ones of the plurality of the cross members of the gate terminal and between the two parallel side members of the gate terminal;
- a drain terminal region located on a second side of selected ones of the plurality of the cross members of the gate terminal and between the two parallel side members of the gate terminal; and
- a plurality of body contact regions bisecting each one of the plurality of source terminal regions wherein portions of each one of the plurality of source terminal regions are disposed on both sides of each one of the plurality of body contact regions, each one of the plurality of body contact regions electrically connecting the corresponding source terminal region and the channel region.

* * * * *